US011861276B2

(12) United States Patent
Vargo et al.

(10) Patent No.: US 11,861,276 B2
(45) Date of Patent: Jan. 2, 2024

(54) LOCATING A CENTER POINT OF A LUG NUT FOR AN AUTOMATED VEHICLE WHEEL REMOVAL SYSTEM

(71) Applicant: RoboTire, Inc., Canton, MI (US)

(72) Inventors: Bradley Vargo, White Lake, MI (US); Keegan Elliott, Marshall, MI (US); William Mapes, Grosse Ille Township, MI (US); Scott Coburn, Howell, MI (US); Riyadir Alalami, Novi, MI (US); Anoopkumar Sandip Sonar, Somerville, MA (US)

(73) Assignee: RoboTire, Inc., Canton, MI (US)

( * ) Notice: Subject to any disclaimer, the term of this patent is extended or adjusted under 35 U.S.C. 154(b) by 0 days.

(21) Appl. No.: 17/975,910

(22) Filed: Oct. 28, 2022

(65) Prior Publication Data
US 2023/0137789 A1   May 4, 2023

Related U.S. Application Data

(60) Provisional application No. 63/273,145, filed on Oct. 28, 2021.

(51) Int. Cl.
*G05B 15/02* (2006.01)
*G06F 30/27* (2020.01)
*B60B 7/06* (2006.01)

(52) U.S. Cl.
CPC .............. *G06F 30/27* (2020.01); *B60B 7/068* (2013.01); *G05B 15/02* (2013.01)

(58) Field of Classification Search
CPC .......... B60B 7/068; G06F 30/27; G05B 15/02
See application file for complete search history.

(56) References Cited

U.S. PATENT DOCUMENTS 4,876,728 A * 10/1989 Roth ...................... G06V 10/26
382/199
2021/0114408 A1 * 4/2021 Darolfi ....................... B25J 5/02

\* cited by examiner

*Primary Examiner* — Yuhui R Pan
(74) *Attorney, Agent, or Firm* — Cognition IP, P.C.; Edward Steakley

(57) ABSTRACT

Described is a system (and method) for locating a center point of a lug nut for an automated vehicle wheel removal system. To improve the accuracy of the center point, the system may perform machine learning inferences using two-dimensional (2D) and three-dimensional (3D) image data. The system may process a 2D image to infer an initial center point, and potentially improve the accuracy by leveraging a 3D image. More particularly, the system may process a 3D image to infer a location of one or more edges (or edge points) around the perimeter of the lug nut and measure a set of distances between the initial center point and the located set of edges. The system may then refine (or adjust) the center point based on such measurements.

17 Claims, 11 Drawing Sheets

LOCATING A CENTER POINT OF A LUG NUT FOR AN AUTOMATED VEHICLE WHEEL REMOVAL SYSTEM

CROSS-REFERENCE TO RELATED APPLICATIONS

This application is a non-provisional application and claims the benefit of provisional U.S. Patent Application No. 63/273,145, filed Oct. 28, 2021, which is hereby incorporated by reference in its entirety.

BACKGROUND

Removal and replacement of wheels from a vehicle has traditionally been a manual and time-intensive process. Such manual operations often lead to inefficient operations, and potential physical hazards to a person performing the removal. Accordingly, certain aspects of the wheel removal and replacement process may be automated or semi-automated with the use of robotics. These robotic systems require guidance systems to locate the wheel and/or components of the wheel. With the use of these guidance systems, the robotic system may physically interact with the wheel. Accordingly, there is the potential to utilize these robotic systems in various vehicle service environments. Although such guidance systems are becoming increasingly accurate, users of such systems (e.g., clients or customers) may still be hesitant to allow robotic systems to interact with vehicle components over concerns that components of the wheel such as the rim may be damaged. Moreover, when such robotic systems are deployed in a customer environment, it may be necessary for the guidance systems to accurately account for different wheel configurations for the various types of vehicles that may be serviced. Accordingly, ensuring the accuracy of these guidance systems becomes increasingly important. Thus, there is a continued need to improve techniques to accurately locate components of a vehicle wheel.

BRIEF DESCRIPTION OF THE DRAWINGS

The accompanying drawings, which are incorporated into and constitute a part of this specification, illustrate embodiments of the disclosure and together with the description, serve to explain the principles of the disclosure.

DETAILED DESCRIPTION

Figure 1:
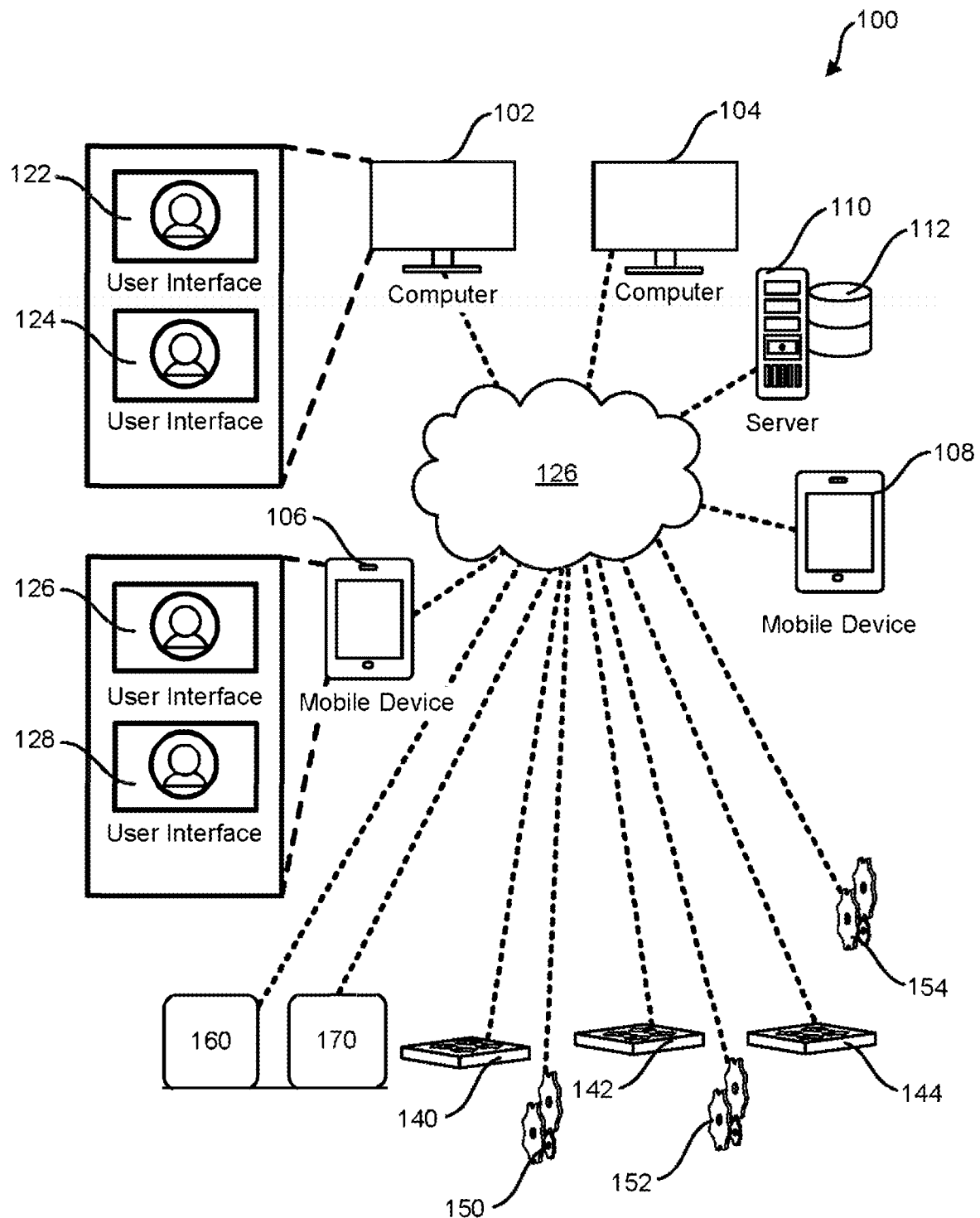
FIG. 1 is a diagram illustrating an example of a system that may be used in conjunction with one or more embodiments of the disclosure.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure. Although these embodiments are described in sufficient detail to enable one skilled in the art to practice the disclosed embodiments, it is understood that these examples are not limiting, such that other embodiments may be used and changes may be made without departing from their spirit and scope. For example, the operations of methods shown and described herein are not necessarily performed in the order indicated and may be performed in parallel. It should also be understood that the methods may include more or fewer operations than are indicated. In some embodiments, operations described herein as separate operations may be combined. Conversely, what may be described herein as a single operation may be implemented in multiple operations.

Reference in the specification to "one embodiment" or "an embodiment" or "some embodiments," means that a particular feature, structure, or characteristic described in conjunction with the embodiment can be included in at least one embodiment of the disclosure. The appearances of the phrase "embodiment" in various places in the specification do not necessarily all refer to the same embodiment.

In some embodiments, described is a system (and method) for locating a center point of a lug nut for an automated vehicle wheel removal system. The system may be used in conjunction with a robotic apparatus to aid in the precision and efficiency of the automated removal of a lug nut from a vehicle wheel.

To improve the accuracy of the center point, the system may leverage multiple types of image data. For example, the system may perform machine learning inferences using two-dimensional (2D) and three-dimensional (3D) image data to determine a center point of a lug nut. In some embodiments, the system may process a 2D image to infer an initial center point. Although the initial center point inference may provide a high degree of accuracy, the accuracy may be improved upon in certain circumstances by leveraging a 3D image and existing knowledge of the general shape of a lug nut. More particularly, the system may also process a 3D image to infer a location of one or more edges (or edge points) around the perimeter of the lug nut.

When detecting an edge, a machine learning model may leverage existing knowledge about the general shape and/or topography of the lug nut. For example, the system may know there is typically a distinct change in depth (e.g., discontinuity) between the face portion and the side portion that creates an edge.

Once a set of edges (or edge points) are located. The system may further refine the initial center point. For example, due the generally circular shape of a lug nut, determining various edge points around the perimeter of the lug nut may correspond to points around the circumference of the lug nut. Accordingly, the geometry of the generally circular shape may be leveraged. For example, once the set of edges are identified, the system may measure a set of distances between the initial center point and the located set of edges. In other words, the system may determine whether the initial center point is the true center point based on a radius measurement of the lug at different angles. Put another way, if the initial center point is at true center, then the radius measurements at the different angles would be equal (or substantially equal). Accordingly, if the initial center point is not true, the system may refine (or adjust) the center point based on the radius measurements. For example, the system may determine an average radius measurement, and refine the center point such that a distance from the refined center point to each of the set of edges corresponds to the determined average.

As a result, the system may improve lug nut location accuracy. For example, even slight improvements to a determined center point of a lug nut provide significant increases in accuracy of guidance systems used for automated wheel removal.

System Overview

Referring to FIG. 1, an exemplary system 100 for the automated removal and replacement of a wheel and tire is disclosed. The system 100 can be a system of one or more computers 102, 104, 106, 108, 110 (generally referred to as 102) including software executing a method system on one or more computers 102, which is in communication with, or maintains one or more databases 112 of information. While the database 112 is depicted as coupled with one computer 110, the database may be distributed, replicated in whole or part, and communicatively coupled to other computers 102. For example, portions or subsets of data may be distributed to various computers 102 to allow for local database access of information stored on database 112. The information stored by the system 100 may include, but is not limited to, the following databases:

Customer Database, including fields such as cust_record_id, customer name, customer address, customer_phone_number.

Customer Vehicle Database, including fields such as cust_veh_record_id, vehicle_make, vehicle_model, vehicle_identification_number, vehicle_license_plate, vehicle_year, vehicle_color, desired_tire_pressure, desired_gas_type, wheel_locks.

General Vehicle Database, including fields gen_veh_record_id, vehicle_make, vehicle_model, vehicle_year, lifting_point_coordinates, lifting_height, axle_distance, tpms_type, lugnut_configuration.

Inventory Database, including fields such as inv_record_id, tire_quantity, tire_size, tire_brand, manufacturer, speed_rating, pressure_setting, location_stored, location coordinates.

Scheduling Database including fields such as sched_record_id, cust_record_id, cust_veh_record_id, schedule_appointment_date_and_time, front_tire_SKU_numbers, rear_tire_SKU_numbers.

The system 100 may include other tables, and database files, and may store images and other sensor data obtained by the system 100 as described herein.

The system 100 generates tire change jobs based on received customer information and customer vehicle information. The system 100 may use the received information as control parameters to direct the control or operation of a vehicle lifting device for lifting vehicles and robotic apparatus for lug nut and wheel removal and replacement as disclosed herein. The system 100 may receive and store images associated with a customer vehicle in a database 112. The system 100 uses image evaluation processes to perform object detection, and/or create 3-dimensional model of a wheel of a vehicle. The system 100 interacts and is communicatively coupled with one or more vehicle lifting devices 140, 142, 144 (generally referred to as 140), with one or more robotic apparatus 150, 152, 154 (generally referred to as 150) and one or more tire removal/replacement machines 160, and one or more tire balancing machines 170. The system 100 may include multiple interfaces 122, 124, 126, 128 (generally referred to as 122) based on the particular functionality to be performed by the system 100. For example, the system 100 may include a customer interface for receiving customer and vehicle information; an operator interface for control and operation of the vehicle lifting device 140, the robotic apparatus 150, the tire removal/replacement machines 160, and/or the tire balancing machines 170. Additionally, other interfaces may be utilized.

In one example, a user interface receives information to schedule the replacement of tires for a vehicle. This information is stored in a data repository of the system. The architecture of the system allows for interaction with multiple remote devices, such as tablet, cellular phone, laptop, other mobile internet connected devices, and the like. A software application, program, web page or other processes may be executed on the remote devices. The system 100 retrieves and stores the information which is obtained from multiple users with respect to scheduling a tire change job. Each of the users are providing control parameters for the operation of the robotic apparatus 150 that will be later used to perform the automated lifting, and wheel removal and replacement onto their vehicle.

The system 100 may use a computer network 126 for communication to one or more computers 102 of the system 100. As described herein, the computer network 120, may include, for example, a local area network (LAN), a virtual LAN (VLAN), a wireless local area network (WLAN), a virtual private network (VPN), cellular network, wireless network, the Internet, or the like, or a combination thereof. Communication among devices of may be performed using any suitable communications protocol such as TCP/IP or EtherNET IP.

Vehicle lifting devices 140 may be communicatively coupled to the system 100 via computer network 120. The vehicle lifting devices 140 may receive instructions, commands and other data from the system 100. The vehicle lifting device 140 may include different types of sensors to obtain sensor data describing a vehicle. The sensor data obtained by the vehicle lifting device 140 may be transmitted to the system 100 for analysis and/or storage into a database 112. The vehicle lifting device 140 provides a mechanism to physically lift a vehicle in a vertical manner according to a predetermined height value.

Robotic apparatus 150 may be communicatively coupled to the system 100 via computer network 120. The robotic apparatus 150 may receive instructions, commands and other data from the system 100. The robotic apparatus 150 is further described herein. The robotic apparatus 150 may include different types of sensors integrated into the robotic apparatus 150 to obtain sensor data describing the vehicle. The sensor data obtained by the robotic apparatus 150 may be transmitted to the system 100 for analysis and/or storage into a database 112. The robotic apparatus 150 provides a mechanism to physically remove a wheel from a vehicle and physically replace the wheel back onto the vehicle. As further described, the robotic apparatus 150 may have different configurations of tooling ends that allow for the removal and replacement of wheel fasteners and the removal and replacement of the wheel from a vehicle wheel hub.

One or more tire removal machines 160 may be communicatively coupled to the system 100 via computer network 120. The tire removal machine 160 may receive instructions, commands and other data from the system 100. The tire removal machine 160 may include different types of sensors integrated into the tire removal machine 160 to obtain sensor data describing a wheel and/or tire. The sensor data obtained by the tire removal machine 160 may be transmitted to the system 100 for analysis and/or storage into a database 112. The tire removal machine 160 may receive one or more parameters, such as wheel size, tire size, tire pressure monitoring system (TPMS) location, desired tire inflation PSI value and/or a value for a type of gas such as air, or nitrogen to be used for tire inflation.

One or more tire balancing machines 170 may be communicatively coupled to the system 100 via computer network 120. The tire balancing machine 170 may receive instructions, commands and other data from the system 100. The tire balancing machine 170 may include different types of sensors integrated into the tire balancing machine 170 to obtain sensor data describing a wheel and/or tire. The sensor data obtained by the tire removal machine 170 may be transmitted to the system 100 for analysis and/or storage into a database 112.

Figure 2A:
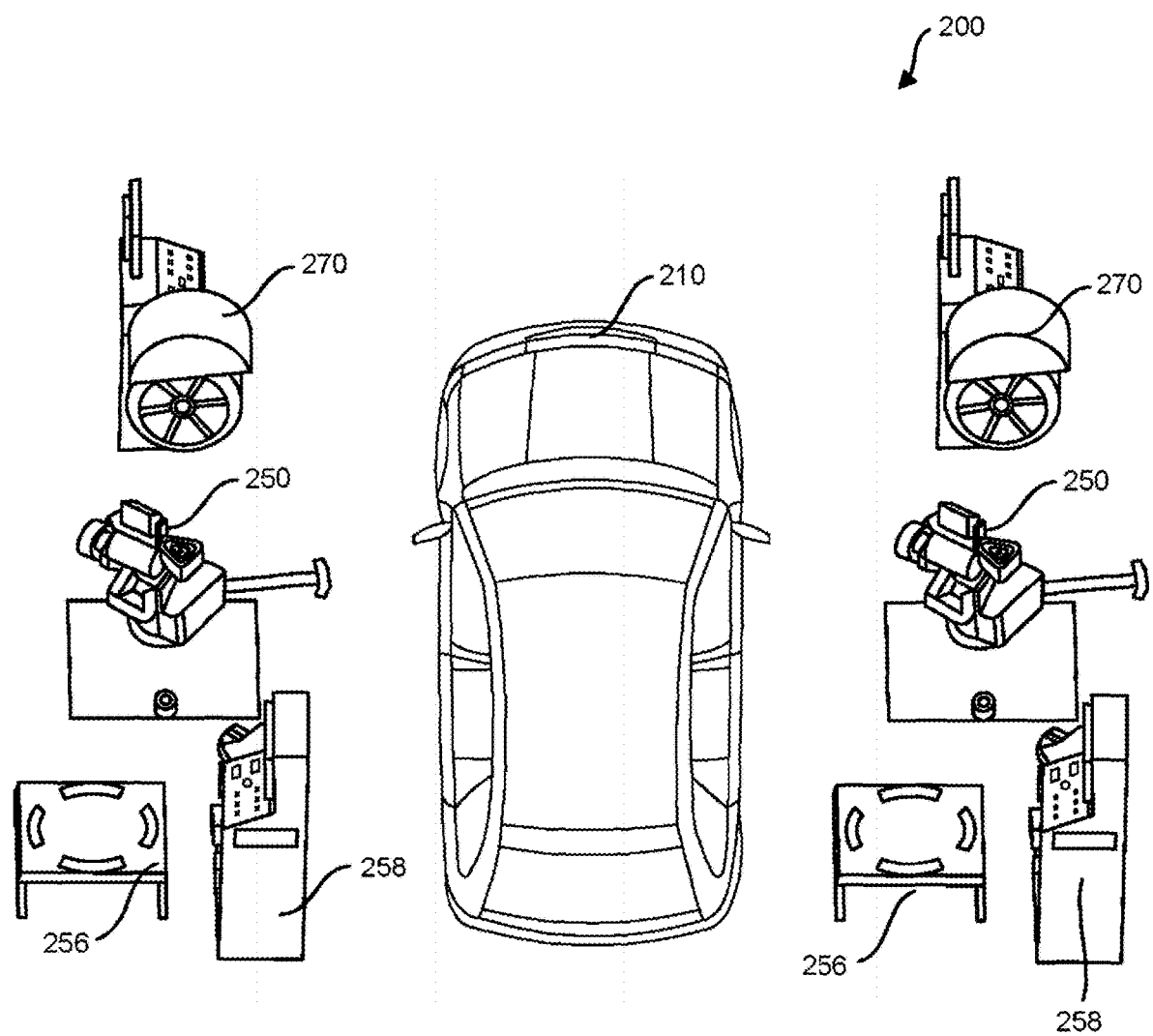
FIG. 2A is a diagram illustrating an example of an automated wheel removal station according to one or more embodiments of the disclosure.

FIG. 2A illustrates an example of an automated wheel removal and wheel replacement station 200. The example illustrates a vehicle 210 positioned over a vehicle lifting device 140 (not shown). In one embodiment of the station 200, two robotic apparatus 250 (e.g., also referred to as robotic apparatus 150) are positioned in a proximate location where the robotic apparatus 250 can interact with a vehicle 210 and manipulate the wheel fasteners, remove the wheels, and replace the wheels. Additionally, depicted are wheel holding stations 256 where the robotic apparatus 250 may place a removed wheel onto the wheel holding station 256, and/or where a wheel may be positioned in advance of the wheel being placed back onto the vehicle 210. The actual location of the wheel holding station 256 may be positioned in any convenient location for operation of the robotic apparatus 250.

Additionally, a control station 258 may be used for control and operation of the robotic apparatus 250. The control station may be used for manual and/or automated control of the robotic apparatus 250. The control station 258 may receive instructions, commands and other data from the system (e.g., system 100). For example, a user interface of the system may provide for instructions to directly control the robotic apparatus 250. The control station 258 may be communicatively coupled to control the robotic apparatus 250. Also, depicted are tire balancing machines 270 that are communicatively coupled to the system (e.g., system 100).

Figure 2B:
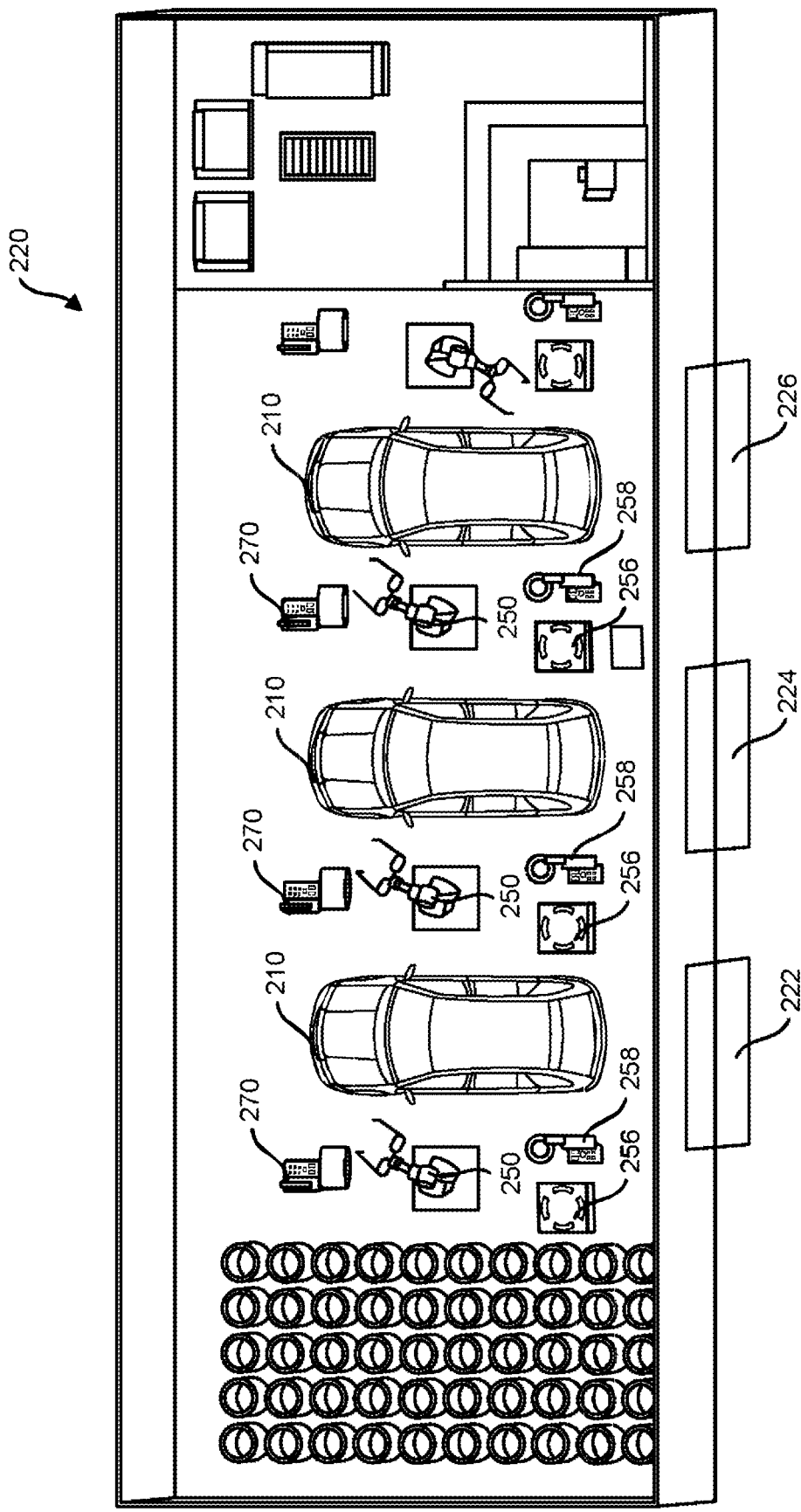
FIG. 2B is a diagram illustrating an example of automated wheel removal stations according to one or more embodiments of the disclosure.

FIG. 2B illustrates an example of automated wheel removal and wheel replacement stations. This example illustrates a physical structure 220 with three bays 222, 224, 226. The physical structure 220 includes multiple robotic apparatus 250 (also referred to as robotic apparatus 150), multiple control stations 258, multiple wheel holding stations 256, and multiple tire balancing machines 270. This example illustrates a configuration where multiple vehicles 210 may be serviced by the robotic apparatus 250 for automated wheel removal, tire change and wheel replacement.

Robotic Apparatus

Figure 3:
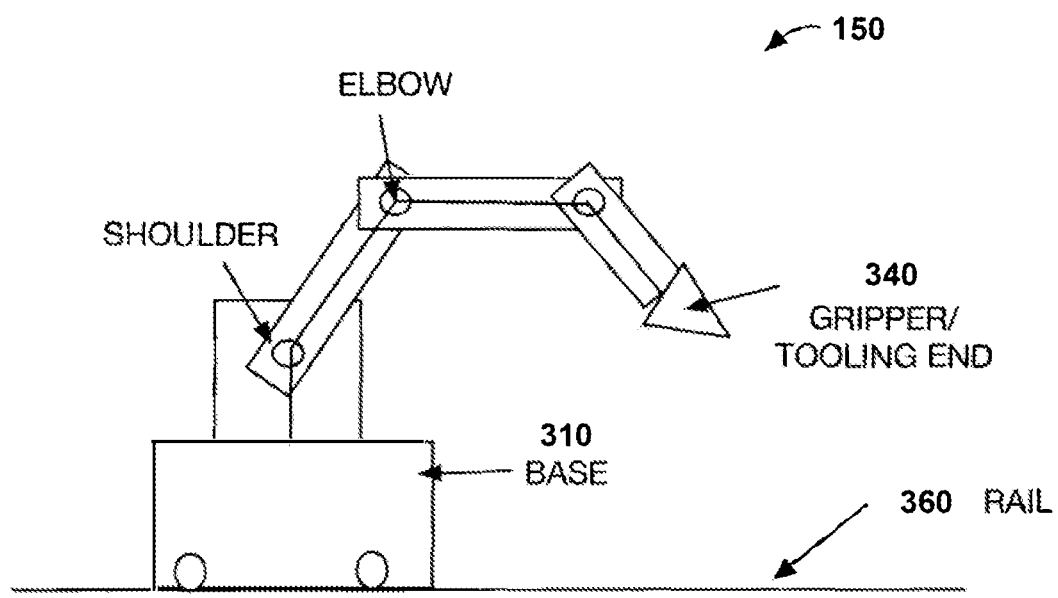
FIG. 3 is a block diagram illustrating an example robotic apparatus that may be used in conjunction with one or more embodiments of the disclosure.

FIG. 3 shows an example robotic apparatus 150 for wheel removal (and replacement). The robotic apparatus 150 is in electronic communication with the system (e.g., one or more components of system 100). The robotic apparatus 150 may receive instructions, commands and data from the system. Likewise, the robotic apparatus may send data, and other information to the system.

In some embodiments, the robotic apparatus 150 has control circuitry, processors, and data storage. While the disclosure discusses operable communication with the system, the robotic apparatus 150 may perform the methods described herein without interaction with the system. For example, the robotic apparatus 150 may include a computing system having one or more processing units that may perform wheel remove and replacement without interaction with the system. The robotic apparatus 150 may be programmed and configured to perform operations in a stand-alone manner. A complete or partial copy of data from the database (e.g., database 112) may be locally stored in the robotic apparatus 150 data storage.

The robotic apparatus 150 may include different types of sensors for the inspection of a vehicle's wheel, these may include proximity sensors, video or still image cameras, LIDAR, thermal sensors, lighting, pressure sensors, and any combination thereof. These sensors may be arranged in various configurations. The robotic apparatus 150 may obtain sensor data describing the wheel of a vehicle. For example, the sensors may obtain image information for a wheel, and the system may analyze the image to determine orientation of the lug nuts, to determine physical geometry of the wheel, and to determine other aspects of the wheel. The sensor information obtained by the robotic apparatus 150 may be stored by the system and may be associated with the particular vehicle and/or tire change job.

In some embodiments, the robotic apparatus 150 is a 6-axis robot, or articulated robot, that allows articulated and interpolated movement to any point within a working envelope. At axis 1, the robot rotates the base 310 of the robot. At axis 2, the robot extends forward and backward the robot's lower arm. At axis 3, the robot raises and lowers the robot's upper arm. At axis 4, the robot's upper arm can wrist roll. At axis 5, the robot's lowers wrist of the robot's arm. At axis 6, the robot rotates wrist of the arm. The arm may have a tooling end 340 with sensors, a torque wrench, and/or other devices attached.

The robotic apparatus 150 may include proximity sensors to detect objects within a working envelope, or within a threshold distance, of the robotic apparatus 150. The working envelope is a physical volume of space of movement and/or operation of the robotic apparatus 150. For example, a sensor may detect movement of a person that walks near or into the working envelope of the robotic apparatus 150. The system may determine that the detected object is with a certain distance of the robotic apparatus 150. If the detected object is determined to be within a threshold distance of the robotic apparatus or the working envelope, then the system may direct the robotic apparatus 150 to cease movement and/or other operations. The system may generate an error condition, and display the error condition to a user interface of the system. In one example, the robotic apparatus 150 may automatically resume operation once the system determines that the detected object is no longer within the working envelope, or within the threshold distance of the robotic apparatus 150. In another example, to resume operations, the user interface receives an input to resume operations. In response to the received input, the robotic apparatus 150 resumes operation.

Additionally, proximity sensors may be placed in a working environment, such as a vehicle bay, and the proximity sensors are communicatively coupled to the system. Similar to the discussion above, the system may receive sensor data from the proximity sensors and detect an object within a working space, the system may in response to detecting the object, cause one or more robotic apparatus 150 to cease operations when the object moves into the working environment.

Robotic Apparatus Placement

The number of robotic apparatus 150 may be positioned in different locations for operation and access to vehicle wheels. The following illustrates exemplary placement of a robotic apparatus and is not meant to be limiting. For example, one robotic apparatus may be positioned at two locations for access to a left and right side of a vehicle. The robotic apparatus may include a multipurpose tool for tire and lug nut removal. The robotic apparatus 150 may be affixed to a rail 360 thereby allowing linear movement of the robotic apparatus along the rail.

In another example, two robotic apparatus 150 may be attached to a guide of rail 360. In this configuration, one of the robotic apparatus is tooled for lug nut removal, and the other for wheel removal. The robotic apparatus may move in a linear fashion to access the front and rear wheel on a particular side of the vehicle.

In another example, four robotic apparatus 150 may be positioned with two robotic apparatus on each side of a vehicle. One robotic apparatus may be configured for lug nut removal and another for wheel removal.

A robotic apparatus 150 may be located in a position where the robotic apparatus 150 may be able to perform operations on two vehicles. The ability of a robotic apparatus 150 to interleave work between two vehicles is discussed further below in the section on tire change job coordination. The system may execute tire change job operations on two vehicles. For example, the system may instruct a particular robotic apparatus 150 to perform a wheel removal operation for a first vehicle. The robotic apparatus after taking off the wheel, may hand the wheel off for further procession. After handing off the wheel, the system may direct the robotic apparatus to rotate toward a second vehicle. The system may instruct the robotic apparatus 150 to perform a wheel replacement operation for the second vehicle. The robotic apparatus 150 may pick up a wheel that was previously taken off of the second vehicle. The robotic apparatus then may perform a tire replacement of the wheel onto the second vehicle. In other words, a particular robotic apparatus may perform operations on one vehicle in one bay, and then turn or rotate the robotic apparatus 150 to perform operations on a second vehicle in a second bay.

Robotic Tooling Head

The robotic apparatus 150 may include a multipurpose tool head 340 that is equipped with a gripping mechanism, torque wrench and/or sensing system to detect or confirm lug nut position and lug nut type. The tool head 340 is configured to remove the lug nuts thereby allowing removal of a wheel. The tool head 340 may also replace lug nuts after the wheel is replaced onto a wheel hub. The tooling end of the robotic apparatus 150 may be configured to remove lug nuts for a 4-lug nut, 5-lug nut, 6-lug nut or 8-lug nut configuration. The tooling end may include multiple attachment ends for different socket configurations. In one embodiment, the tooling end includes a singular socket that is moved to each determined lug nut position. In another embodiment, the tooling end uses multiple sockets to concurrently remove or replace two or more lug nuts simultaneously.

In one example, the robotic apparatus 150 may include two independent tool heads with a sensing system that will either grip the wheel for removal and install, or removal and install lug nuts.

A cleaning system may be added to the robotic apparatus 150 or as a stand-alone system to clean the wheel thereby providing a surface of the wheel and lug nuts for better visibility by a sensor of the robotic apparatus, such as a digital camera. The cleaning system may be controlled via the robotic apparatus via the system 100.

It should be noted that the robotic apparatus 150 and various other components of the system (e.g., system 100) may be used to perform various automated functions such as vehicle wheel and lug nut removal and replacement, socket selection, tire removal and mounting, etc. Further details of some of these function is further described in commonly owned U.S. Pat. No. 10,773,550, filed on Apr. 17, 2019, and titled, "AUTOMATED REMOVAL AND REPLACEMENT OF VEHICLE WHEELS AND TIRES," which is incorporated in its entirety herein for all purposes. Accordingly, the center point detection of a lug nut as further described herein may aid in accurately locating a lug nut to perform such automated functions.

Computer Vision

The system (e.g., system 100) may include a computer vision system (or module) that processes obtained images (e.g., 2D or 3D images). As described herein, various components may use computer vision cameras, or other sensors to assist in the location determination of physical aspects of the vehicle such as the physical geometry of physical aspects of the wheels.

Figure 4:
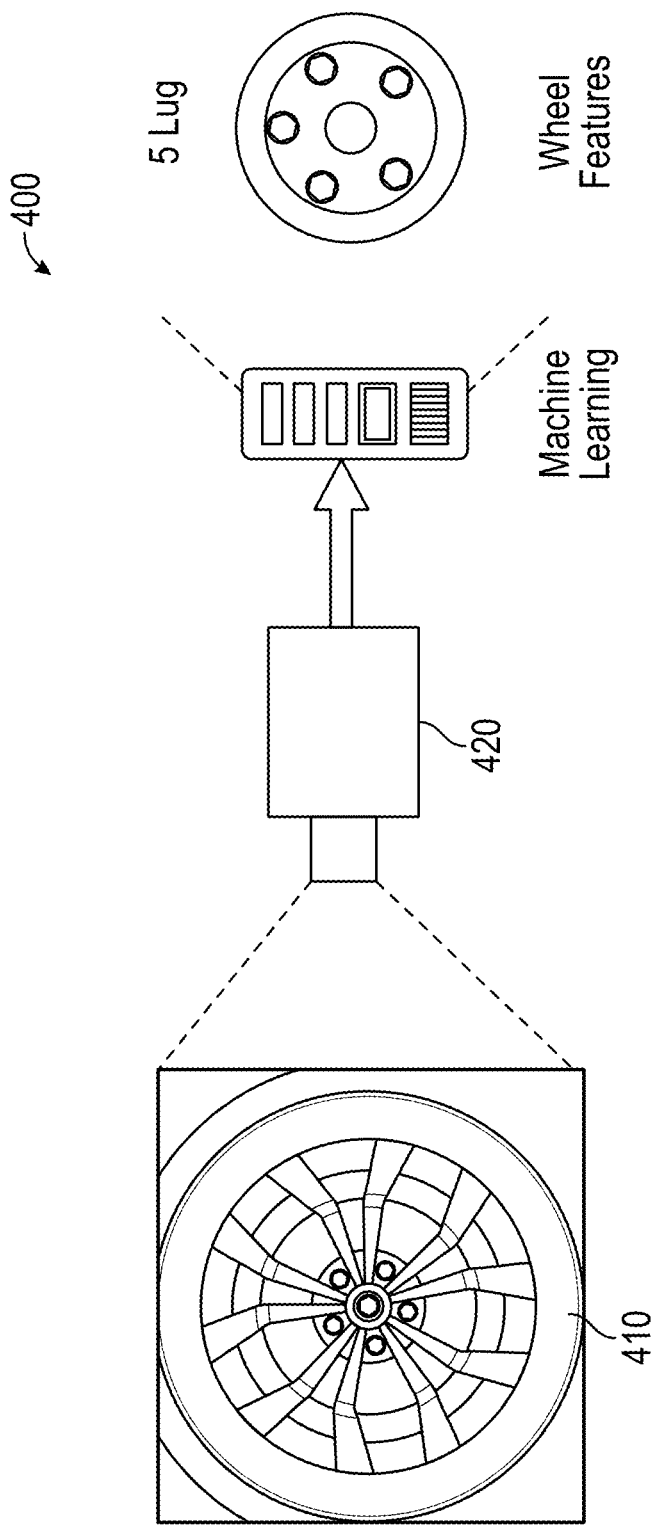
FIG. 4 is a diagram illustrating an example flow of determining a center point for a lug nut from an image according to one or more embodiments of the disclosure.

FIG. 4 illustrates a schematic illustration of an image capture system 400 obtaining one or more images 410 (e.g., images 505, and 605 as referred to herein) via a computer vision camera 420 and performing one more inferences using one or more machine learning models (or algorithms). It should be noted that the image 410 may be obtained in the form of a point cloud. As shown, the system may process the image 410 using machine learning. For example, the system may use a trained neural network to identify features of a lug nut (e.g., center point, edges, etc.). For example, using machine learning training techniques, the system may be trained with multiple images of a lug nut and corresponding center points and/or edges (or perimeter edges). Using the trained model in a production mode, the system may identify a lug nut center point, edges, or other features from a received image 410 as an input to the trained neural network. Accordingly, machine learning inferences may be performed to identify various features of a lug nut.

As shown, the system may obtain an image 410 of a vehicle wheel. As described, the image 410 may be obtained from different devices or computers of the system, for example, one or more digital cameras coupled to the robotic apparatus 150, or via a mobile device communicatively coupled to the system. The system may process the obtained image 410 via the trained neural network as a data input, and an image classifier may then determine lug nut features such as center points, edges, lug nut pattern (e.g., number of bolts), nut type, etc.

Additionally, fiducial markers may be placed on a wheel fastener to indicate a location of a lug nut. As an example, stickers with certain patterns, colors, shapes, or a combination thereof, may be placed on the wheel. This may help a robotic apparatus in determining one or more positions of lug nuts of the vehicle. Fiducial markers may be wireless devices that may be affixed to the vehicle. The wireless device may be for example a blue-tooth enabled socket that is placed onto the lug nut. The socket size of the blue-tooth enabled socket may be for example in the sizes of (SAE ¾ inch, ⅞ inch, ¹³⁄₁₆ inch; Metric 17 mm, 19 mm, 21 mm). Each of the wireless devices may emit a unique signal or signature that may be recognized by the system. Using multiple fiducial markers on the lug nuts the system may determine the lug nut configuration of the wheel. The system may detect the position of fiducial markers placed adjacently to one another, or placed across from one another, or placed on the second or third lug nut. The system may then determine the center or centroid of two markers (as further described herein) and calculate the distance between the markers. Additionally, the system may determine the angle of two lines from a first fiducial marker and to a second fiducial marker, and then from the second fiducial marker to a third fiducial marker that have been placed on the lug nuts.

Moreover, the system may identify the fiducial markers in an image taken by a camera (e.g., camera 420), for example, an image taken by a camera of the vehicle lifting device or a camera of the robotic apparatus. The system processes the image to detect objects in the image. Based on the detected object, the system may identify the position of the marker. A fiducial maker may be associated with a particular meaning or action by the system. For example, based on a pattern or color of the marker, the system may identify the marker as lug nut location, a lifting point location, etc.

Lug Nut Center Point Detection and Refinement

As described, the system may be used in conjunction with a robotic apparatus (e.g., robotic apparatus 150) to more accurately identify a center point of a lug nut to aid in the precision and efficiency of the automated removal of a lug nut from a vehicle wheel.

Figure 5:
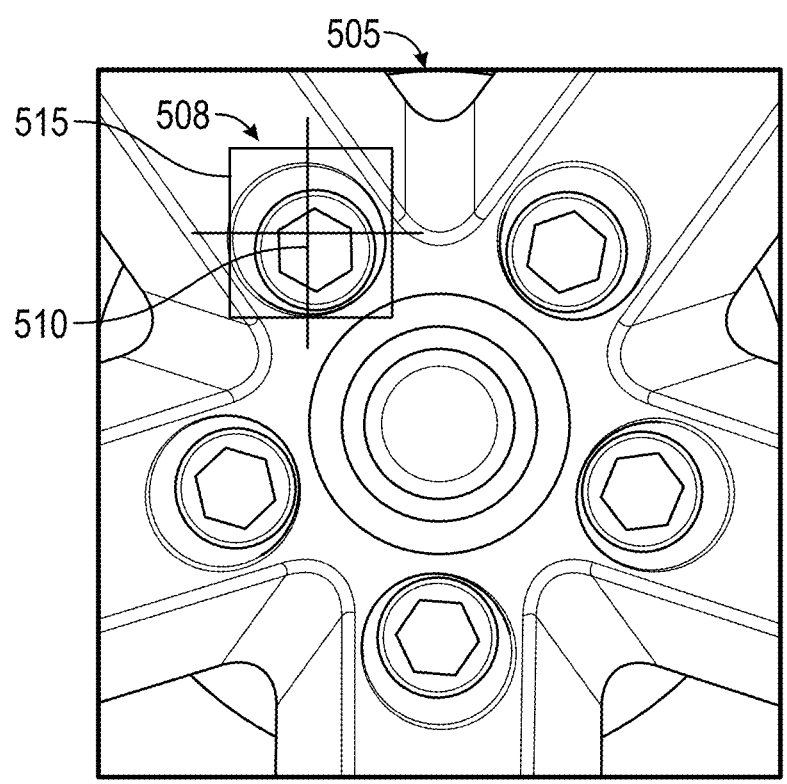
FIG. 5 is a diagram illustrating an example of an image from which an initial center point of a lug nut is inferred from the two-dimensional information according to one or more embodiments of the disclosure.

FIG. 5 is an example of an image from which an initial center point of a lug nut is inferred from the two-dimensional information according to one or more embodiments of the disclosure.

As shown, the system may obtain a two-dimensional (2D) image 505 depicting a side elevation view of at least a portion of a vehicle wheel including one or more lug nuts. As shown, the face portion of a first lug nut 508 may be captured by the image 505. As referred to herein, a "lug nut" may refer to various types of lug nuts (e.g., cone seat, bulge cone seat, under hub cap, spline drive, etc.), as well as various types of lug bolts. It should be noted that for simplicity, this example illustrates the system determining an initial center point 510 for a particular lug nut, but the system may perform such a determination for multiple, or all of the lug nuts on the wheel sequentially, or simultaneously (or substantially simultaneously). The system may determine (e.g., infer) an initial center point (or centroid) 510 of the first lug nut 508 from the image 505. The system may determine the initial center point 510 by processing the image 505 using one or more machine learning models (or algorithms). For example, the system may input image 505 into a machine learning model, which then outputs the inferred initial center point 510. In some embodiments, the machine learning model may perform object detection to identify the first lug nut 508, and as shown in this example, create a bounding box 515 for the identified lug nut. Although various methods may be used to determine the initial center point 510, in some embodiments, the initial center point 510 may be determined based on the created bounding box 515. For example, the center point 510 may correspond to the center point (or centroid) of the bounding box 515.

In some embodiments, the initial center point 510 may be expressed using 2D coordinates (e.g., Cartesian coordinates) such as (x,y) coordinates. These coordinates may be mapped onto a three-dimensional (3D) image (e.g., point cloud) as further described herein. In some embodiments, the image 505 may be obtained from a computer vision system that includes one or more cameras and various other sensors or devices (e.g., LIDAR, structured light 3d imaging, or other 3d image capture device) to capture various types of information including 2D and 3D images/information. For example, although 3D information may be captured by the computer vision system, only the 2D information in the form of 2D image 505 may be provided to a machine learning model to infer the initial center point 510.

In some embodiments, although the center point 510 may be inferred with a certain degree of accuracy, the system may refine (or adjust) the location of the initial center point 510 by processing a corresponding 3D image as further described with reference to FIG. 6.

Figure 6:
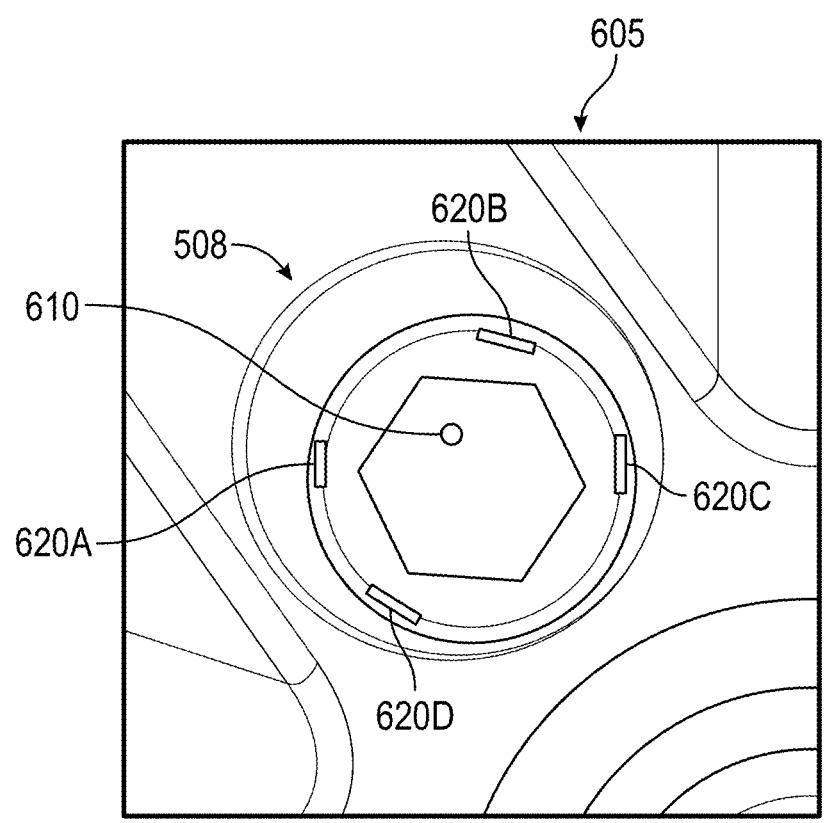
FIG. 6 is a diagram illustrating an example of an image from which a location of one or more lug nut edges are inferred from three-dimensional information according to one or more embodiments of the disclosure.

FIG. 6 is an example of an image from which a location of one or more lug nut edges are inferred from three-dimensional information according to one or more embodiments of the disclosure. It should be noted that although a generally 2D image is shown in the example of FIG. 6, the points discussed below may represent points within a 3D space (e.g., point cloud).

Image 605 represents a 3D image depicting a side elevation view of the portion of the vehicle wheel that includes the first lug nut 508. As described, an initial center point (e.g., center point 510) for the first lug nut 508 was inferred from a 2D image (e.g., image 505). Accordingly, the initial center point may be mapped to 3D image 605. More particularly, as shown, mapped center point 610 is the point within the 3D image 605 that corresponds to the initially inferred center point from the 2D image. In some embodiments, the 2D coordinates (e.g., (x,y) coordinates) representing the inferred center point may be mapped to 3D coordinates (e.g., (x, y, z) coordinates) representing mapped center point 610. For example, the 2D coordinates of the initial center point may be mapped to a point cloud representing the 3D image.

The system may then refine center point 610 using the 3D image information. More particularly, the system may use computer vision to determine various features of the lug nut from the 3D information. The system may locate one or more edges of a lug nut to generally determine various points around the perimeter of the lug nut viewed from a side elevation of a wheel as shown in this example. As shown, the system may locate a set of edges (or edge points, or points of an edge) 620 (e.g., edges 620A-620D) at various points around a perimeter of the first lug nut 508 by processing the 3D image. In some embodiments, the processing may include performing object detection to identify one or more lug nuts including the first lug nut 508. In addition, as part of the object detection, or a separate processing, the system may locate the set of edges 620 generally around (or forming) the perimeter of the first lug nut 508. In some embodiments, an edge may correspond to an edge of the nut portion of a lug nut, an edge of the seat portion of the lug nut, or combination thereof. In some embodiments, an edge of the lug nut may correspond to (or be defined by) the portion of the lug nut in which the face of the lug nut transitions to (or connects with) a side of the nut portion. When detecting an edge the system may leverage existing knowledge about the general shape and/or topography of the lug nut. For example, the system may know there is typically a distinct change in depth (e.g., discontinuity) between the face portion and the side portion that creates an edge. Accordingly, the system may measure the depth at various points of the lug nut to identify an edge.

Due to the generally circular shape of the face of a lug nut (or cylindrical shape of the entire lug nut), determining various edge points around the perimeter of the lug nut may correspond to points around the circumference of the lug nut. As further described herein, the geometry of the generally circular shape may be leveraged. For example, once the set of edges 620 are identified, the system may refine the location of mapped center point 610 as further described with reference to FIG. 7.

Figure 7:
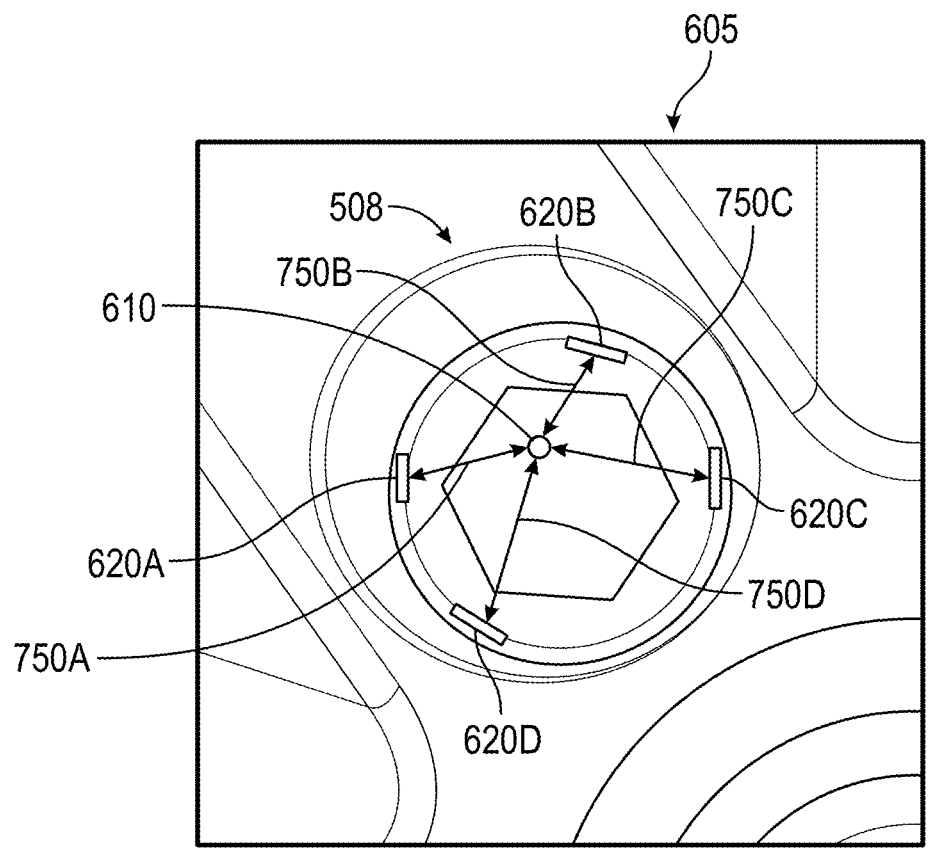
FIG. 7 is a diagram illustrating an example of an image in which an inferred center point of a lug nut may be refined based on a set of located lug nut edges

FIG. 7 is an example of an image in which an inferred center point of a lug nut may be refined based on a set of located lug nut edges.

As shown, after determining a set of edges 620 (e.g., edges 620A-D) of the first lug nut 508, the system may determine a set of distances 750 (e.g., 750A-750D) by determining (or measuring, calculating, etc.) distances between center point 610 and one or more of the set of edges 620 (e.g., 620A-620D). More particularly, as shown, the set of distances 750 may include distances 750A, 750B, 750C, and 750D, which are the distances between mapped center point 610 and points on edges 620A 620B, 620C, and 620D respectively. Based on the determined set of distances 750, the system may determine whether the accuracy of center point 610 may be improved. More particularly, the system may leverage the generally circular shape of a lug nut to determine whether the distance between center point 610 and various points around the circumference (or perimeter) of the lug nut are equal (or substantially equal). In other words, the system may determine whether center point 610 is the true (or accurate) center point based on measuring the radius of the lug nut from center point 610 at different angles. Put another way, if center point 610 is at the true center, then the radius measurements at the different angles would be equal (or substantially equal).

The system may refine (adjust, update, improve, etc.) center point 610 in various ways based on the determined distances 750. For example, the system may perform a refinement based on one or more of the distances 750. In some embodiments, the system may refine center point 610 based on an average of the distances 750. For example, if distances for 750A, 750B, 750C, and 750D are 0.30, 0.40, 0.40, and 0.30 inches respectively, the center point 610 may be positioned (or located) such that the distance from center point 610 to each of the edges 620A-D is 0.35 inches. In other words, the center point 610 may be refined such that a radius measurement from the updated position to each of the determined edges (e.g., edges 620A-D) are the same. When determining average distance, the system may use of all of the determined distances (e.g., 750A-D as used in the above example), or less than all (e.g., 750A-C). For instance, the system may discard certain distances that appear to be outliers (e.g., based on a threshold variance). As another example, the system may discard the shortest and longest distances and base the average on the remaining distances. As another example, the system may use distances determined to the location of edges deemed most accurate. For instance, the system may take into account confidence scores or intervals for a distance or associated edge when refining the center point 610.

Figure 8:
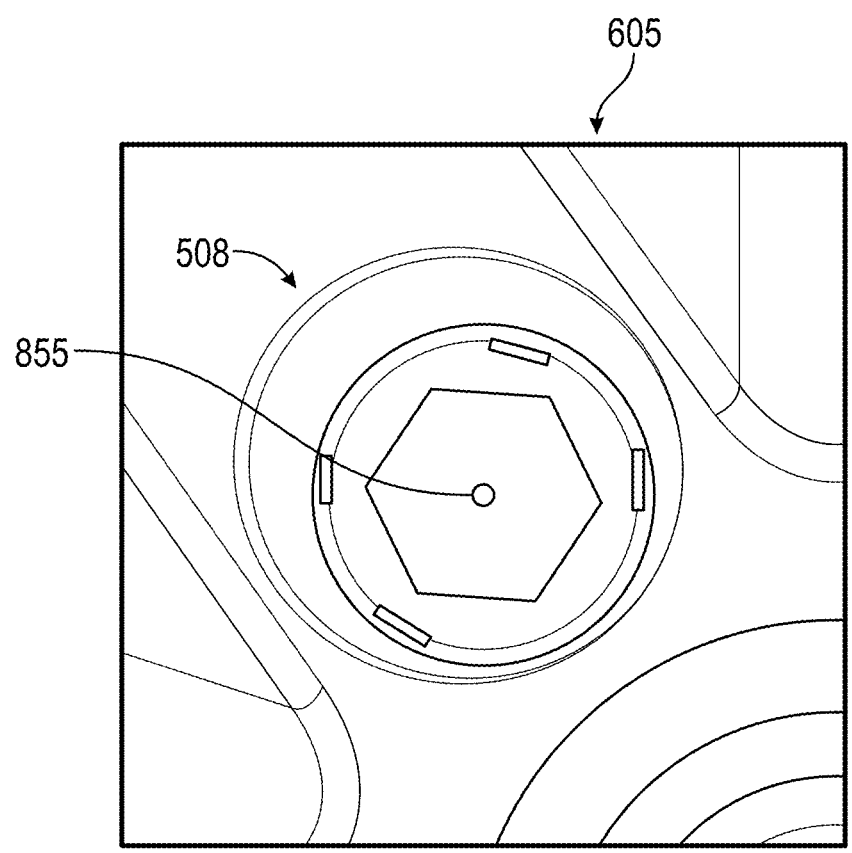
FIG. 8 is a diagram illustrating an example of an image with an updated center point according to one or more embodiments of the disclosure.

FIG. 8 is an example of an image showing an updated center point according to one or more embodiments of the disclosure. As shown, the system may determine an updated (or refined, true, improved, more accurate, etc.) center point 855 for the first lug nut 508 within image 605. As described, the distance from center point 855 and one or more of the previously identified points on edges 620A-D, would be substantially the same.

Figure 9:
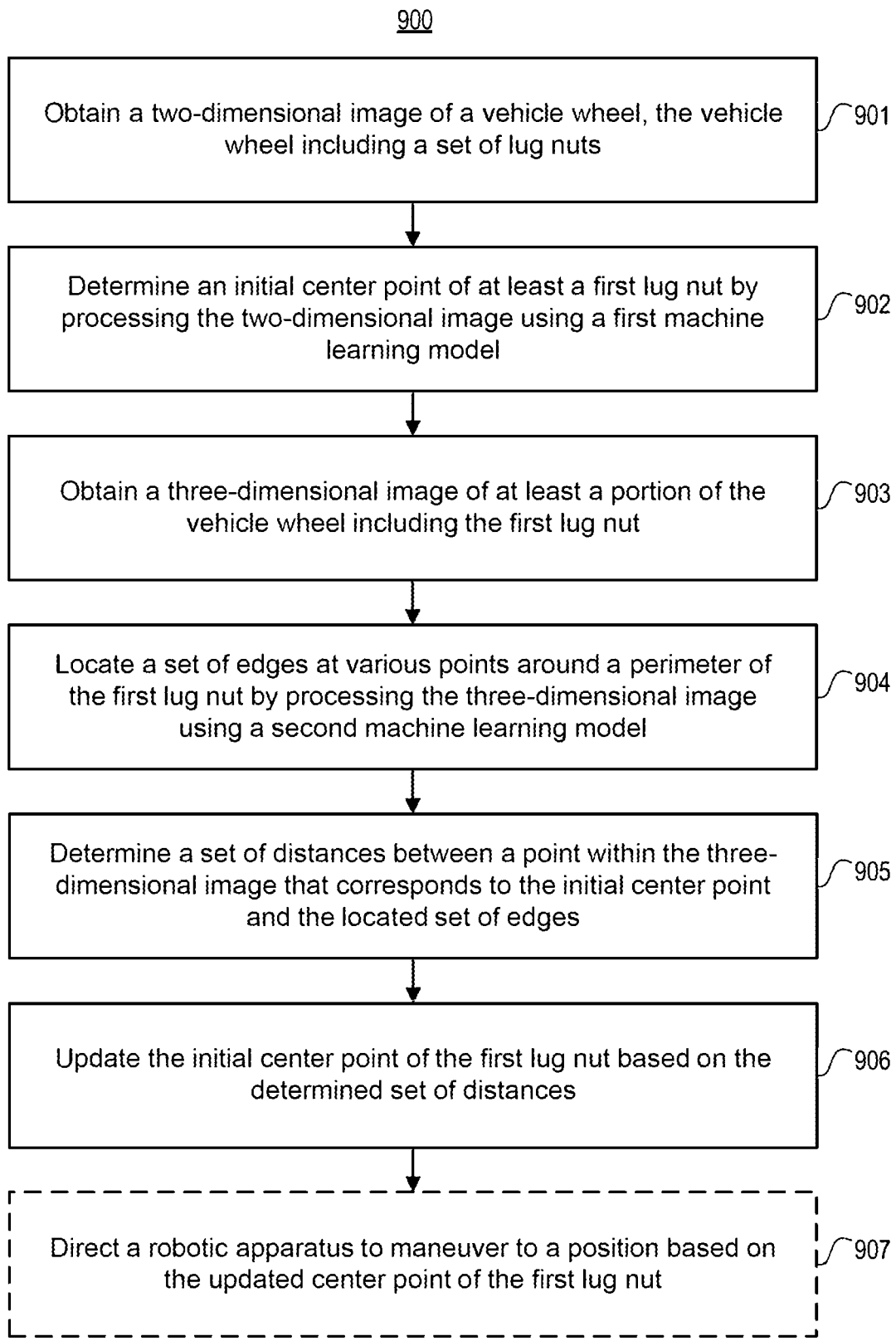
FIG. 9 is a process flow diagram illustrating an example method of updating an initial center point of a lug nut according to one or more embodiments of the disclosure.

FIG. 9 is a process flow diagram illustrating an example method of updating an initial center point of a lug nut according to one or more embodiments of the disclosure. Process 900 may use processing logic, which may include software, hardware, or a combination thereof. For example, process 900 may be performed by a system including one or more components described in system 100.

In 901, the system (e.g., computer 102) may obtain a two-dimensional (2D) image (e.g., image 505) of a vehicle wheel including a set of lug nuts. The system may obtain the 2D image (e.g., still or video/live image) from a digital camera, for example, operatively connected to, or part of, the system. For example, the digital camera may be part of the robotic apparatus (e.g., robotic apparatus 150).

In 902, the system may determine an initial center point (e.g., center point 510) of at least a first lug nut (e.g., lug nut 508) by processing the two-dimensional (2D) image using a first machine learning (ML) model. For example, the system may determine an initial center point of at least a first lug nut using the 2D image to perform (or initiate) a first machine learning inference.

In some embodiments, the first machine learning model (or first set of ML models) may be trained to infer features of a vehicle wheel from 2D information. For example, the first machine learning model may be trained to perform lug nut detection and determine an initial center point (e.g., center point 510) for the detected lug nut. In other words, the system may provide (e.g., input) the 2D image to the machine learning model to perform an inference. The machine learning model may then process the 2D image and output (e.g., provide) the initial (e.g., predicted) center point. In some embodiments, the processing may be performed remotely. For example, the system may provide the obtained 2D image to a remote computing device to perform machine learning inferences and the remote computing device may return the inferred data.

In 903, the system may obtain a three-dimensional (3D) image (e.g., image 605) of at least a portion of the vehicle wheel including the first lug nut. The system may obtain the 3D image (e.g., still or video/live image) from a digital camera. In some embodiments, the same digital camera may capture the 2D image and 3D image. In some embodiments, the 3D image may be provided as point cloud. Accordingly, the topography of the first lug nut may be analyzed with one or more machine learning models to identify one or more edges as further described.

In some embodiments, the system may map a set of two-dimensional coordinates representing the initial center point to a set of three-dimensional coordinates representing the point (e.g., mapped center point 610) within the three-dimensional image that corresponds to the initial center point. For example, if the inferred initial center point from the 2D image has coordinates (435, 565), the corresponding point within the 3D image may be mapped to coordinates (435, 565, 0).

In 904, the system may locate (or identify, determine, etc.) a set of edges (e.g., edges 620) at various points around a perimeter of the first lug nut by processing the three-dimensional (3D) image using a second machine learning model. For example, the system may locate the set of edges using the 3D image to perform (or initiate) a second machine learning inference. In other embodiments, the system uses 3d point cloud data, and analyzes the said point cloud data to determine various points of edges to determine 'true' center of the first lug nut.

In some embodiments, the system may identify the first lug nut and the set of edges using a computer vision system. In some embodiments, the computer vision system may use a second machine learning model (or second set of ML models) that is/are trained to infer features of a vehicle wheel from 3D information. For example, the computer vison system may use various machine learning algorithms to perform object detection when identifying one or more lug nuts. In addition, the computer vison system may use one or more machine learning algorithms to perform edge detection to locate one or more edges of the identified lug nut. In some embodiments, the processing may be performed remotely. For example, the system may provide the obtained 3D image to a remote computing device to perform machine learning inferences and the remote computing device may return the inferred data As described, the system (e.g., computer vision system) may locate the set of edges by performing edge detection. For example, the system may use any suitable edge detection algorithm (or model). For instance, the edge detection algorithm may identify discontinuities in depth when locating the edges of a lug nut. Accordingly, in some embodiments, locating the set of edges may include determining a change of depth between a plurality of points proximate to the various points around the perimeter of the first lug nut, and locating the set of edges at the various points around the perimeter of the first lug nut based on the determined change of depth.

In some embodiments, locating the set of edges may include determining a confidence score for each edge of the set of edges, and retaining only those edges satisfying a predetermined confidence score as part of the located set of edges.

In some embodiments, the system may leverage existing knowledge of the general shape of the nut portion of a lug nut. For example, the shape of the nut portion may be a hexagon. Accordingly, the system may rely on the nut portion having six relatively flat sides when locating one or more edges. For instance, the system may locate a point on an edge of each of the six sides when locating the set of edges.

In 905, the system may determine (or calculate, measure, etc.) a set of distances (e.g., distances 750) between a point (e.g., mapped center point 610) within the three-dimensional (3D) image that corresponds to the initial center point and the located set of edges. As described, the initial center point inferred from the 2D image (e.g., center point 510) may be mapped into the 3D image (e.g., point cloud) to obtain a mapped point (e.g., mapped center point 610). The obtained 3D image may be a still image or set of images (e.g., live or video image).

In 906, the system may update the initial center point of the first lug nut based on the determined set of distances (e.g., update the initial center point 510/610 to center point 855).

In some embodiments, updating the initial center point may include determining an average distance of the determined set of distances (e.g., average of distances 750A-D), and updating the initial center point such that a distance from the updated center point (e.g., center point 855) to each of the set of edges (e.g., edges 620A-D) corresponds to the determined average distance.

In some embodiments, determining the average distance may be based on two or more of the determined distances. For example, in some embodiments, the system may discard certain distances, or distances from edges, that have a confidence score that is below a predefined threshold. Conversely, the system may include only those distances, or distances from edges, that have a confidence score above a predefined threshold. For example, if edges 620A, 620B, and 620C have a confidence score above a predefined threshold, the system may only include distances 750A, 750B, and 750C when determining the average distance.

In some embodiments, the system may position a robotic apparatus (e.g., robotic apparatus 150) based on the updated center point.

More particularly, in 907, the system may direct a robotic apparatus operatively connected to the system to maneuver to a position based on the updated center point of the first lug nut. In some embodiments, the robotic apparatus may be directed to maneuver to the positon as part of a sequence of operations to remove the first lug nut from the vehicle wheel.

In some embodiments, the system may determine one or more dimensions of the first lug nut based on the updated center point and the determined set of distances. For example, the system may use a measurement from the updated center point to one or more of the located edges to determine a size of the nut portion of the lug nut. As another example, the system may determine a dimension of the nut portion based on the determined average distance of the set of distances (e.g., average of distances 750A-D). Accordingly, the system may determine a size of the lug nut (e.g., hex size) based on the determined one or more dimensions of the lug nut. Accordingly, the system may also direct a robotic apparatus to select a socket corresponding to the determined lug nut size. In some embodiments, the robotic apparatus may select the socket/socket size (e.g., SAE ¾ inch, ⅝ inch, 13/16 inch; Metric 17 mm, 19 mm, 21 mm) as part of a sequence of operations to remove the first lug nut from the vehicle wheel.

As noted, operations described above may be performed in parallel. For example, the system may perform inferences on the 2D image and the 3D image at the same time.

Example Computing System

Figure 10:
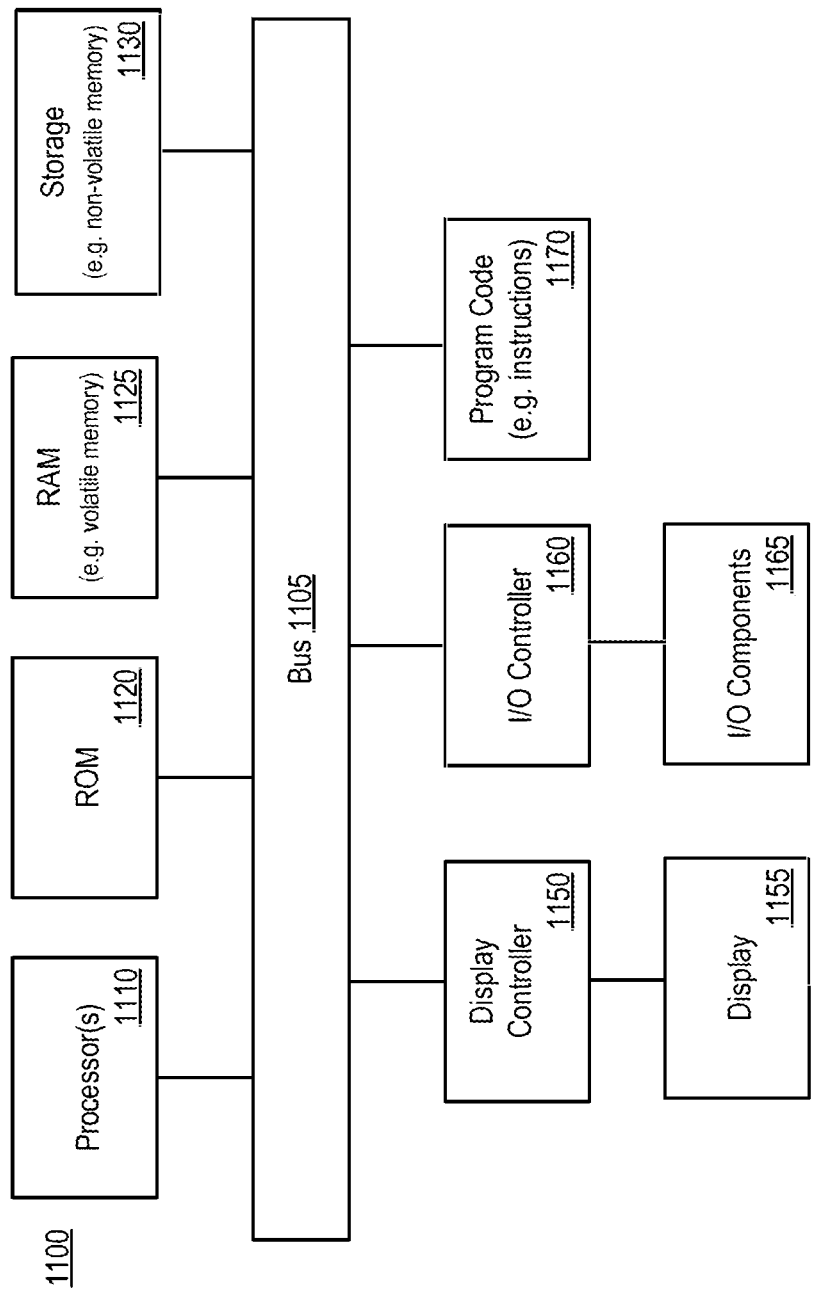
FIG. 10 is a block diagram illustrating an example of a computing system that may be used in conjunction with one or more embodiments of the disclosure.

FIG. 10 shows a block diagram of an example of a computing system that may be used in conjunction with one or more embodiments of the disclosure. For example, computing system 1100 (or system, or server, or computing device, or device) may represent any of the devices or systems (e.g., system 100, computer 102, robotic apparatus 150, etc.) described herein that perform any of the processes, operations, or methods of the disclosure. Note that while the computing system 1100 illustrates various components, it is not intended to represent any particular architecture or manner of interconnecting the components as such details are not germane to the present disclosure. It will also be appreciated that other types of systems that have fewer or more components than shown may also be used with the present disclosure.

As shown, the computing system 1100 may include a bus 1105 which may be coupled to a processor 1110, ROM (Read Only Memory) 1120, RAM (or volatile memory) 1125, and storage (or non-volatile memory) 1130. The processor(s) 1110 may retrieve stored instructions from one or more of the memories 1120, 1125, and 1130 and execute the instructions to perform processes, operations, or methods described herein. These memories represent examples of a non-transitory computer-readable medium (or machine-readable medium, a computer program product, etc.) containing instructions (or program code) which when executed by a processor (or system, device, etc.), cause the processor to perform operations, processes, or methods described herein.

As referred to herein, for example, with reference to the claims, a processor may include one or more processors. Moreover, the one or more processors 1110 may perform operations in an on-demand or "cloud computing" environment or as a service (e.g., within a "software as a service" (SaaS) implementation). Accordingly, the performance of operations may be distributed among the one or more processors 1110, whether residing only within a single machine or deployed across a number of machines. For example, the one or more processors 1110 may be located in a single geographic location (e.g., within a home environment, an office environment, or a server farm), or may be distributed across a number of geographic locations. The RAM 1125 may be implemented as, for example, dynamic RAM (DRAM), or other types of memory that require power continually in order to refresh or maintain the data in the memory. Storage 1130 may include, for example, magnetic, semiconductor, tape, optical, removable, non-removable, and other types of storage that maintain data even after power is removed from the system. It should be appreciated that storage 1130 may be remote from the system (e.g., accessible via a network).

A display controller 1150 may be coupled to the bus 1105 in order to receive display data to be displayed on a display device 1155, which can display any one of the user interface features or embodiments described herein and may be a local or a remote display device. The computing system 1100 may also include one or more input/output (I/O) components 1165 including cameras (e.g., camera 420), mice, keyboards, touch screen, network interfaces, printers, speakers, and other devices. Typically, the input/output components 1165 are coupled to the system through an input/output controller 1160. In addition, a robotic apparatus (e.g., robotic apparatus 150) may be coupled to the system via controller 1160.

Program code 1170 may represent any of the instructions, applications, software, libraries, toolkits, modules, components, engines, units, functions, logic, etc. as described herein (e.g., computer 102, machine learning models, computer vision models, etc.). Program code 1170 may reside, completely or at least partially, within the memories described herein (e.g., non-transitory computer-readable media), or within a processor during execution thereof by the computing system. Program code 1170 may include both machine code, such as produced by a compiler, and files containing higher-level or intermediate code that may be executed by a computing system or other data processing apparatus (or machine) using an interpreter. In addition, program code 1170 can be implemented as software, firmware, or functional circuitry within the computing system, or as combinations thereof. Program code 1170 may also be downloaded, in whole or in part, through the use of a software development kit or toolkit that enables the creation and implementation of the described embodiments.

Moreover, any of the disclosed embodiments may be embodied in various types of hardware, software, firmware, and combinations thereof. For example, some techniques disclosed herein may be implemented, at least in part, by non-transitory computer-readable media that include program instructions, state information, etc., for performing various methods and operations described herein.

It should be noted that references to ordinal numbers such as "first," "second," "third," etc., may indicate an adjective for an element (e.g., any noun in the application). The use of ordinal numbers does not necessarily imply or create any particular ordering of the elements nor limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements. In addition, the use of the term "or" indicates an inclusive or (e.g., and/or) unless otherwise specified. For example, the phrase "at least one of x, y, or z" means any one of x, y, and z, as well as any combination thereof. In addition, the term "based on" is used to describe one or more factors that affect a determination. These terms do not foreclose additional factors that may affect a determination. For example, the phrase "determining A based on B" includes B being a factor that affects the determination of A, and does not foreclose the determination of A from also being based on C. However, in other instances, A may be determined based solely on B, such as by the use of the terms "only," "solely," and other such terminology. In addition, the term "approximately" or "substantially" may be used herein and may be interpreted as "as nearly as practicable," "within technical limitations," and the like.

Other embodiments of the disclosure will be apparent to those skilled in the art from consideration of the specification and practice of the invention disclosed herein. It is intended that the specification and examples be considered as examples only, with a true scope and spirit of the embodiments being indicated by the claims.

What is claimed is:

1. A system for locating a center of a lug nut comprising:
   one or more processors; and
   a non-transitory computer-readable medium storing a plurality of instructions, which when executed, cause the one or more processors to:
   obtain a two-dimensional image of a vehicle wheel, the vehicle wheel including a set of lug nuts;
   determine an initial center point of at least a first lug nut by processing the two-dimensional image using a first machine learning model;
   obtain a three-dimensional image of at least a portion of the vehicle wheel including the first lug nut;
   locate a set of edges at various points around a perimeter of the first lug nut by processing the three-dimensional image using a second machine learning model;
   determine a set of distances between a point within the three-dimensional image that corresponds to the initial center point and the located set of edges;
   update the initial center point of the first lug nut based on the determined set of distances; and map a set of two-dimensional coordinates representing the initial center point to a set of three-dimensional coordinates representing the point within the three-dimensional image that corresponds to the initial center point.

2. The system of claim 1, wherein updating the initial center point of the first lug nut based on the determined set of distances includes:
   determining an average distance of the determined set of distances; and
   updating the center point such that a distance from the updated center point to each of the set of edges corresponds to the determined average distance.

3. The system of claim 1, wherein locating the set of edges includes:
   determining a confidence score for each edge of the set of edges; and
   retaining only those edges satisfying a predetermined confidence score as part of the located set of edges.

4. The system of claim 1, wherein locating the set of edges includes:
   determining a change of depth between a plurality of points proximate to the various points around the perimeter of the first lug nut; and
   locating the set of edges at the various points around the perimeter of the first lug nut based on the determined change of depth.

5. The system of claim 1, wherein the plurality of instructions, when executed, further cause the one or more processors to:
   direct a robotic apparatus to maneuver to a position based on the updated center point of the first lug nut as part of a sequence of operations to remove the first lug nut from the vehicle wheel.

6. The system of claim 1, wherein the plurality of instructions, when executed, further cause the one or more processors to:
   determine one or more dimensions of the first lug nut based on the updated center point and the determined set of distances.

7. The system of claim 6, wherein the plurality of instructions, when executed, further cause the one or more processors to:
   determine a lug nut size based on the determined one or more dimensions of the first lug nut; and
   direct a robotic apparatus to select a socket corresponding the determined lug nut size as part of a sequence of operations to remove the first lug nut from the vehicle wheel.

8. A computer-implemented method for locating a center of a lug nut comprising:
   obtaining a two-dimensional image of a vehicle wheel, the vehicle wheel including a set of lug nuts;
   determining an initial center point of at least a first lug nut by processing the two-dimensional image using a first machine learning model;
   obtaining a three-dimensional image of at least a portion of the vehicle wheel including the first lug nut;
   locating a set of edges at various points around a perimeter of the first lug nut by processing the three-dimensional image using a second machine learning model;
   determining a set of distances between a point within the three-dimensional image that corresponds to the initial center point and the located set of edges;
   updating the initial center point of the first lug nut based on the determined set of distances; and
   mapping a set of two-dimensional coordinates representing the initial center point to a set of three-dimensional coordinates representing the point within the three-dimensional image that corresponds to the initial center point.

9. The method of claim 8, wherein updating the initial center point of the first lug nut based on the determined set of distances includes:
   determining an average distance of the determined set of distances; and
   updating the center point such that a distance from the updated center point to each of the set of edges corresponds to the determined average distance.

10. The method of claim 8, wherein locating the set of edges includes:
    determining a confidence score for each edge of the set of edges; and
    retaining only those edges satisfying a predetermined confidence score as part of the located set of edges.

11. The method of claim 8, wherein locating the set of edges includes:
    determining a change of depth between a plurality of points proximate to the various points around the perimeter of the first lug nut; and
    locating the set of edges at the various points around the perimeter of the first lug nut based on the determined change of depth.

12. The method of claim 8, further comprising:
    directing a robotic apparatus to maneuver to a position based on the updated center point of the first lug nut as part of a sequence of operations to remove the first lug nut from the vehicle wheel.

13. A non-transitory computer-readable medium storing instructions which, when executed by one or more processors of a system, cause the system to perform operations comprising:
    obtaining a two-dimensional image of a vehicle wheel, the vehicle wheel including a set of lug nuts;
    determining an initial center point of at least a first lug nut by processing the two-dimensional image using a first machine learning model;
    obtaining a three-dimensional image of at least a portion of the vehicle wheel including the first lug nut;
    locating a set of edges at various points around a perimeter of the first lug nut by processing the three-dimensional image using a second machine learning model;
    determining a set of distances between a point within the three-dimensional image that corresponds to the initial center point and the located set of edges; and
    updating the initial center point of the first lug nut based on the determined set of distances and
    mapping a set of two-dimensional coordinates representing the initial center point to a set of three-dimensional coordinates representing the point within the three-dimensional image that corresponds to the initial center point.

14. The non-transitory computer-readable medium of claim 13, wherein updating the initial center point of the first lug nut based on the determined set of distances includes:
    determining an average distance of the determined set of distances; and
    updating the center point such that a distance from the updated center point to each of the set of edges corresponds to the determined average distance.

15. The non-transitory computer-readable medium of claim 13, wherein locating the set of edges includes:
    determining a confidence score for each edge of the set of edges; and retaining only those edges satisfying a predetermined confidence score as part of the located set of edges.

16. The non-transitory computer-readable medium of claim 13, wherein locating the set of edges includes:
   determining a change of depth between a plurality of points proximate to the various points around the perimeter of the first lug nut; and
   locating the set of edges at the various points around the perimeter of the first lug nut based on the determined change of depth.

17. The non-transitory computer-readable medium of claim 13, storing further instructions which, when executed by the one or more processors of the system, cause the system to perform further operations comprising:
   directing a robotic apparatus to maneuver to a position based on the updated center point of the first lug nut as part of a sequence of operations to remove the first lug nut from the vehicle wheel.

\* \* \* \* \*